US012764865B2

(12) United States Patent
Lee et al.

(10) Patent No.: US 12,764,865 B2
(45) Date of Patent: Oct. 13, 2026

(54) CIRCUIT BOARD AND CHIP PACKAGE COMPRISING SAME

(71) Applicant: LG INNOTEK CO., LTD., Seoul (KR)

(72) Inventors: In Jae Lee, Seoul (KR); Min Sung Jo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 204 days.

(21) Appl. No.: 18/565,577

(22) PCT Filed: May 31, 2022

(86) PCT No.: PCT/KR2022/007790
§ 371 (c)(1),
(2) Date: Nov. 30, 2023

(87) PCT Pub. No.: WO2022/255797
PCT Pub. Date: Dec. 8, 2022

(65) Prior Publication Data

US 2024/0268031 A1 Aug. 8, 2024

(30) Foreign Application Priority Data

Jun. 1, 2021 (KR) ........................ 10-2021-0071136
Oct. 1, 2021 (KR) ........................ 10-2021-0131026

(51) Int. Cl.
*H05K 1/181* (2026.01)
*H05K 1/09* (2006.01)

(52) U.S. Cl.
CPC ............. *H05K 1/181* (2013.01); *H05K 1/092* (2013.01); *H05K 2201/10659* (2013.01)

(58) Field of Classification Search
CPC ..................................................... H05K 1/181
(Continued)

(56) References Cited

U.S. PATENT DOCUMENTS 10,156,078 B2 12/2018 Palsson et al.
10,542,646 B2 1/2020 Lee et al.
(Continued)

FOREIGN PATENT DOCUMENTS

DE 3515001 A1 11/1985
JP 10-341070 A 12/1998
(Continued)

OTHER PUBLICATIONS

Supplementary European Search Report dated May 13, 2025 in European Application No. 22816456.2.
(Continued)

*Primary Examiner* — Timothy J Thompson
(74) *Attorney, Agent, or Firm* — SALIWANCHIK, LLOYD & EISENSCHENK

(57) ABSTRACT

A circuit board according to an embodiment includes: an insulating layer; and a circuit pattern layer disposed on the insulating layer and formed of an alloy, wherein the alloy includes: a first metal having a content in a range of 60 wt % to 80 wt %; a second metal having a content in a range of 10 wt % to 22 wt %; and a third metal having a content in a range of 3 wt % to 20 wt %; wherein the first metal includes any one of nickel (Ni) and iron (Fe), wherein the second metal includes chromium (Cr), and wherein the third metal includes a metal different from the first metal among nickel (Ni) and iron (Fe).

18 Claims, 4 Drawing Sheets

(b)

(58) Field of Classification Search
USPC .......................................................... 174/260
See application file for complete search history.

(56) References Cited

U.S. PATENT DOCUMENTS

| | | | |
|---|---|---|---|
| 2010/0172790 A1 | 7/2010 | Hattendorf et al. | |
| 2018/0279516 A1 | 9/2018 | Lee et al. | |
| 2020/0084888 A1* | 3/2020 | Lee | H05K 1/118 |

FOREIGN PATENT DOCUMENTS

| | | |
|---|---|---|
| KR | 2001-0030534 A | 4/2001 |
| KR | 10-2010-0022488 A | 3/2010 |
| KR | 10-2014-0005463 A | 1/2014 |

OTHER PUBLICATIONS

Office Action dated Jun. 10, 2025 in Korean Application No. 10-2021-0131026.
International Search Report dated Sep. 27, 2022 in International Application No. PCT/KR2022/007790.

* cited by examiner (a)

(b)

(a)

(b)

CIRCUIT BOARD AND CHIP PACKAGE COMPRISING SAME

CROSS-REFERENCE TO RELATED APPLICATIONS

This application is the U.S. national stage application of International Patent Application No. PCT/KR2022/007790, filed May 31, 2022, which claims the benefit under 35 U.S.C. § 119 of Korean Application Nos. 10-2021-0071136, filed Jun. 1, 2021; and 10-2021-0131026, filed Oct. 1, 2021; the disclosures of each of which are incorporated herein by reference in their entirety.

TECHNICAL FIELD

The embodiment relates to a circuit board, and more particularly, to a circuit board applied to a smart IC and a chip package including the same.

BACKGROUND ART

A smart IC card is a card in which at least one integrated circuit chip or chip module is embedded.

The smart IC card is widely used in various fields such as credit cards, SIM cards, security cards, and ID cards. A circuit board applied to such a smart IC card includes an insulating layer and a circuit pattern layer disposed on the insulating layer.

In this case, the circuit pattern layer includes a bonding portion and a contact portion. The bonding portion may mean an upper surface or a first surface of the circuit pattern layer. For example, the bonding portion may mean a surface connected to the IC chip among the surfaces of the circuit pattern layer. In addition, the contact portion may mean a lower surface or a second surface of the circuit pattern layer. For example, the contact portion may refer to a surface of the circuit pattern layer in contact with an external device (e.g., a card reader).

In addition, a surface treatment layer is disposed on the bonding portion and the contact portion of the circuit pattern layer, respectively. The surface treatment layer is formed to impart wire bonding property, corrosion resistance, oxidation resistance, abrasion resistance, and hardness of a certain level or more to the bonding portion and the contact portion of the circuit pattern layer.

However, a conventional circuit board as described above has to necessarily form a surface treatment layer on the circuit pattern layer, thus complicating the manufacturing process of the circuit board and increasing the manufacturing cost. In addition, the conventional circuit board has a problem in that the overall thickness increases as much as the thickness of the surface treatment layer.

DISCLOSURE

Technical Problem

An embodiment provides a circuit board having a new structure and a chip package including the same.

In addition, the embodiment provides a circuit board from which a surface treatment layer to be disposed on at least one of a bonding portion and a contact portion of a circuit pattern layer is removed, and a chip package including the same.

In addition, the embodiment provides a circuit board capable of remarkably reducing the overall thickness and a chip package including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes: an insulating layer; and a circuit pattern layer disposed on the insulating layer and formed of an alloy, wherein the alloy includes: a first metal having a content in a range of 60 wt % to 80 wt %; a second metal having a content in a range of 10 wt % to 22 wt %; and a third metal having a content in a range of 3 wt % to 20 wt %; wherein the first metal includes any one of nickel (Ni) and iron (Fe), wherein the second metal includes chromium (Cr), and wherein the third metal includes a metal different from the first metal among nickel (Ni) and iron (Fe).

In addition, the first metal includes nickel (Ni), wherein the second metal includes iron (Fe), wherein the alloy further includes a fourth metal having a content in a range of 1 wt % to 5 wt %, and wherein the fourth metal includes any one of molybdenum (Mo), manganese (Mn) and molybdenum (Mo)-manganese (Mn) alloy.

In addition, the first metal includes iron (Fe), wherein the second metal includes nickel (Ni), wherein the alloy further includes a fourth metal having a content in a range of 0 wt % to 5 wt %, wherein the fourth metal includes any one of molybdenum (Mo), manganese (Mn) and molybdenum (Mo)-manganese (Mn) alloy.

In addition, the insulating layer includes at least one through hole, wherein the circuit pattern layer includes: a bonding portion formed on a lower surface of the circuit pattern layer and vertically overlapping the through hole; and a contact portion formed on the upper surface of the circuit pattern layer.

In addition, the circuit includes a surface treatment layer disposed on the bonding portion of the circuit pattern layer.

In addition, the surface treatment layer includes a gold metal layer disposed on the bonding portion of the circuit pattern layer and containing gold (Au).

In addition, the surface treatment layer includes a nickel metal layer disposed between the circuit pattern layer and the gold metal layer and containing nickel.

In addition, the alloy further includes a fifth metal having a content in a range of 3 wt % to 10 wt %, and wherein the fifth metal includes any one of silver (Ag), silicon (Si), and a silver (Ag)-silicon (Si) alloy.

In addition, the alloy further includes a sixth metal having a content in a range of 1 wt % to 5 wt %, and wherein the sixth metal includes any one of Manganese (Mn), tin (Sn), zinc (Zn) and an alloy comprising at least two of these metals.

In addition, the circuit board includes a bonding sheet disposed between the insulating layer and the circuit pattern layer, and wherein the bonding sheet includes a through hole.

Meanwhile, a chip package according to an embodiment includes an insulating layer including at least one through hole; a circuit pattern layer disposed on the insulating layer to vertically overlap the through hole and formed of an alloy; an IC chip attached to a lower surface of the insulating layer; and a connecting member connecting a lower surface of the circuit pattern layer vertically overlapping the through hole and a terminal of the IC chip, wherein the alloy includes: a first metal having a content in a range of 60 wt % to 80 wt %; a second metal having a content in a range of 10 wt % to 22 wt %; and a third metal having a content in a range of 3 wt % to 20 wt %; wherein the first metal includes any one of nickel (Ni) and iron (Fe), wherein the second metal includes chromium (Cr), and wherein the third metal includes a metal different from the first metal among nickel (Ni) and iron (Fe).

In addition, the first metal includes nickel (Ni), wherein the second metal includes iron (Fe), wherein the alloy further includes a fourth metal having a content in a range of 1 wt % to 5 wt %, and wherein the fourth metal includes any one of molybdenum (Mo), manganese (Mn) and molybdenum (Mo)-manganese (Mn) alloy.

In addition, the first metal includes iron (Fe), wherein the second metal includes nickel (Ni), wherein the alloy further includes a fourth metal having a content in a range of 0 wt % to 5 wt %, and wherein the fourth metal is any one of molybdenum (Mo), manganese (Mn) and molybdenum (Mo)-manganese (Mn) alloy.

In addition, the chip package includes a surface treatment layer formed on the lower surface of the circuit pattern layer, and wherein the connecting member is in contact with the surface treatment layer.

In addition, the alloy further includes a fifth metal having a content in a range of 3 wt % to 10 wt %, and wherein the fifth metal includes any one of silver (Ag), silicon (Si), and a silver (Ag)-silicon (Si) alloy.

In addition, the alloy further includes a sixth metal having a content in a range of 1 wt % to 5 wt %, and wherein the sixth metal includes any one of Manganese (Mn), tin (Sn), zinc (Zn) and an alloy comprising at least two of these metals.

Advantageous Effects

In the embodiment, a circuit pattern layer is formed using a first alloy of nickel (Ni)-chromium (Cr)-iron (Fe) containing nickel (Ni) as a main component or a second alloy of iron (Fe)-chromium (Cr)-nickel (Ni) containing iron (Fe) as a main component. Accordingly, the circuit pattern layer of the embodiment may have abrasion resistance, corrosion resistance, oxidation resistance, and hardness of a certain level or more. Through this, the embodiment may omit or remove the surface treatment layer to be formed on the contact portion of the circuit pattern layer. Accordingly, the manufacturing process of the circuit board may be simplified and manufacturing cost may be reduced.

In addition, the circuit pattern layer is formed by using a third alloy in which at least one metal of silver (Ag) and silicon (Si) is further included in the first alloy or the second alloy. Through this, the circuit pattern layer may have a predetermined level or more of abrasion resistance, corrosion resistance, oxidation resistance, and hardness, as well as wire bonding property of a predetermined level or more. Through this, the embodiment may omit or remove all of the surface treatment layer to be formed on the contact portion and the bonding portion of the circuit pattern layer. Accordingly, the embodiment may further simplify the manufacturing process of the circuit board and further reduce the manufacturing cost.

MODES OF THE PRESENT INVENTION

Figure 1:
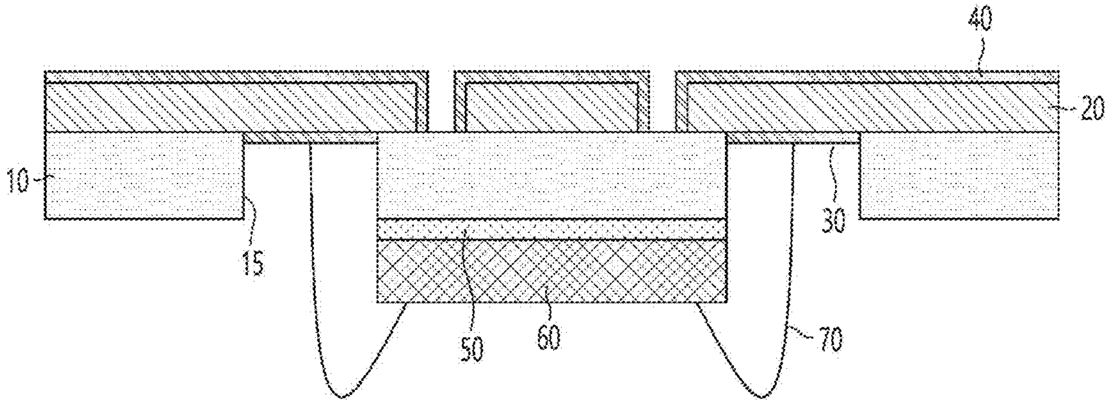
FIG. 1 is a view showing a chip package according to a comparative example.

Hereinafter, embodiments disclosed in the present specification will be described in detail with reference to the accompanying drawings, but identical or similar elements are denoted by the same reference numerals regardless of reference numerals, and redundant descriptions thereof will be omitted. The suffixes "module" and "portion" for the components used in the following description are given or used interchangeably in consideration of only the ease of writing the specification, and do not have meanings or roles that are distinguished from each other by themselves. In addition, in describing the embodiments disclosed in the present specification, if it is determined that a detailed description of related known technologies may obscure the subject matter of the embodiments disclosed in the present specification, the detailed description thereof will be omitted. In addition, the accompanying drawings are only for making it easier to understand the embodiments disclosed in the present specification, and the technical idea disclosed in the present specification is not limited by the accompanying drawings, and this should be understood to include all changes, equivalents, or substitutes included in the spirit and scope of the present invention.

Terms including ordinal numbers such as first and second may be used to describe various elements, but the elements are not limited by the terms. The above terms are used only for the purpose of distinguishing one component from another component.

When a component is referred to as being "contacted" or "connected" to another component, it may be directly connected or connected to the other component, but other components may exist in the middle. On the other hand, when a component is referred to as being "directly contacted" or "directly connected" to another component, it should be understood that there is no other component in the middle.

Singular expressions include plural expressions unless the context clearly indicates otherwise.

In the present application, terms such as "comprises" or "have" are intended to designate the presence of features, numbers, steps, actions, components, parts, or combinations thereof described in the specification, but one or more other features. It is to be understood that the presence or addition of elements or numbers, steps, actions, components, parts, or combinations thereof, does not preclude in advance the possibility of being excluded.

Hereinafter, embodiments of the present invention will be described in detail with reference to the accompanying drawings.

Comparative Example

Before describing the embodiment, a comparative example compared with the circuit board of the embodiment of the present application will be described.

FIG. 1 is a view showing a chip package according to a comparative example.

Referring to FIG. 1, the chip package according to the comparative example includes an insulating layer 10, a circuit pattern layer 20, a first surface treatment layer 30, a second surface treatment layer 40, an adhesive layer 50, an IC chip 60 and a connecting member 70.

The chip package of the comparative example includes the insulating layer 10, and the circuit pattern layer 20 is disposed on at least one surface of the insulating layer 10.

In this case, the circuit pattern layer 20 in the comparative example is a copper layer including pure copper.

The insulating layer 10 includes at least one through hole 15. In addition, the circuit pattern layer 20 includes a bonding portion vertically overlapping with the through hole 15. For example, at least a part of the circuit pattern layer 20 vertically overlaps the through hole 15, and a lower surface of the circuit pattern layer 20 vertically overlapped with the through hole 15 functions as a bonding portion electrically connected to the IC chip 60.

In addition, an upper surface of the circuit pattern layer 20 functions as a contact portion such as a connector that comes into contact with an external device (e.g., a card reader).

In this case, different characteristics are required for the bonding portion and the contact portion of the circuit pattern layer 20.

For example, the bonding portion of the circuit pattern layer 20 is required to have wire bonding property, of a certain level or more for bonding the connection member 70 electrically connected to the IC chip 60.

In addition, the contact portion of the circuit pattern layer 20 is exposed to the outside of the chip package. Accordingly, the contact portion of the circuit pattern layer 20 is required to have corrosion resistance, oxidation resistance, abrasion resistance, and hardness of a certain level or more for continuous connection with an external device.

Accordingly, the first surface treatment layer 30 is formed on the bonding portion of the circuit pattern layer 20, and the second surface treatment layer 40 is formed on the contact portion of the circuit pattern layer. Each of the first surface treatment layer 30 and the second surface treatment layer 40 include a nickel metal layer (Ni) and a gold metal layer (Au).

The nickel metal layer functions as a barrier to inhibit the copper (Cu) from being diffused into the gold metal layer while inhibiting oxidation of copper (Cu) constituting the circuit pattern layer 20. In addition, the gold metal layer of the first surface treatment layer 30 is formed on an outermost surface of the bonding portion of the circuit pattern layer 20, so that the bonding portion has wire bonding property of a certain level or more. In addition, the gold metal layer of the second surface treatment layer 40 is formed on an outermost surface of the contact portion of the circuit pattern layer 20, so that the contact portion has corrosion resistance, oxidation resistance, abrasion resistance, and hardness of a certain level or more.

However, in the circuit board of the comparative example as described above, each of the first surface treatment layer 30 and the second surface treatment layer 40 must be essentially formed on the bonding portion and the contact portion of the circuit pattern layer 20. Accordingly, the comparative example has a problem in that the manufacturing process is complicated and the manufacturing cost is increased.

In addition, in the circuit board of the comparative example, a thickness of the gold metal layer of the second surface treatment layer 40 is reduced for the purpose of reducing the manufacturing cost. However, when the circuit board is used for a long time in a state in which the thickness of the gold metal layer is reduced, abrasion of the gold metal layer occurs, thereby deteriorating the product design.

Meanwhile, the circuit pattern layer 20 in the comparative example is formed of an aluminum alloy in order to remove at least one of the first and second surface treatment layers as described above. However, the aluminum alloy has a low strength characteristic. Accordingly, the thickness of the aluminum alloy must be 80 μm or more in order for the contact portion of the circuit pattern layer to have corrosion resistance, oxidation resistance, abrasion resistance, and hardness of a certain level or more.

And, when the thickness of the aluminum alloy exceeds 80 μm, the overall thickness of the circuit board increases accordingly. In addition, the line width or pitch of the circuit pattern layer 20 increases, thereby reducing the degree of circuit integration.

Accordingly, the embodiment provides a new circuit board for solving the problems of the comparative example as described above. For example, the embodiment reduces the overall thickness of the circuit board, simplifies the manufacturing process of the circuit board, and thereby reduces the manufacturing cost. Furthermore, the embodiment enables the removal of at least one surface treatment layer among the surface treatment layers disposed on the bonding portion and the contact portion of the circuit pattern layer. For example, the embodiment forms a circuit pattern layer using a metal alloy layer having wire bonding properties, corrosion resistance, oxidation resistance, abrasion resistance, and hardness of a certain level or more, so that the surface treatment layer can be removed.

Hereinafter, a circuit board and a chip package including the same according to an embodiment will be described. In this case, the chip package is applicable to various applications. For example, the chip package may be applied to an electronic device including a smart chip, a printer, a camera module, and the like. In addition, the electronic device includes a smart phone, a personal digital assistant, a digital video camera, a digital still camera, a network system, and a computer, a monitor, a tablet, a laptop, a netbook, a television, a video game, a smart watch, an automotive, and the like. However, the present invention is not limited thereto, and may be any other electronic device that processes data.

Figure 2A:
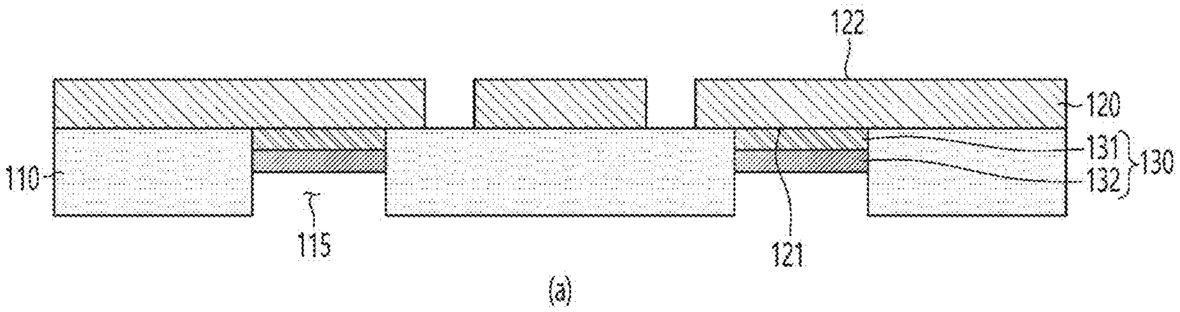
FIGS. 2(*a*) and 2(*b*) are views showing a circuit board and a chip package according to first and second embodiments.
Figure 2B:
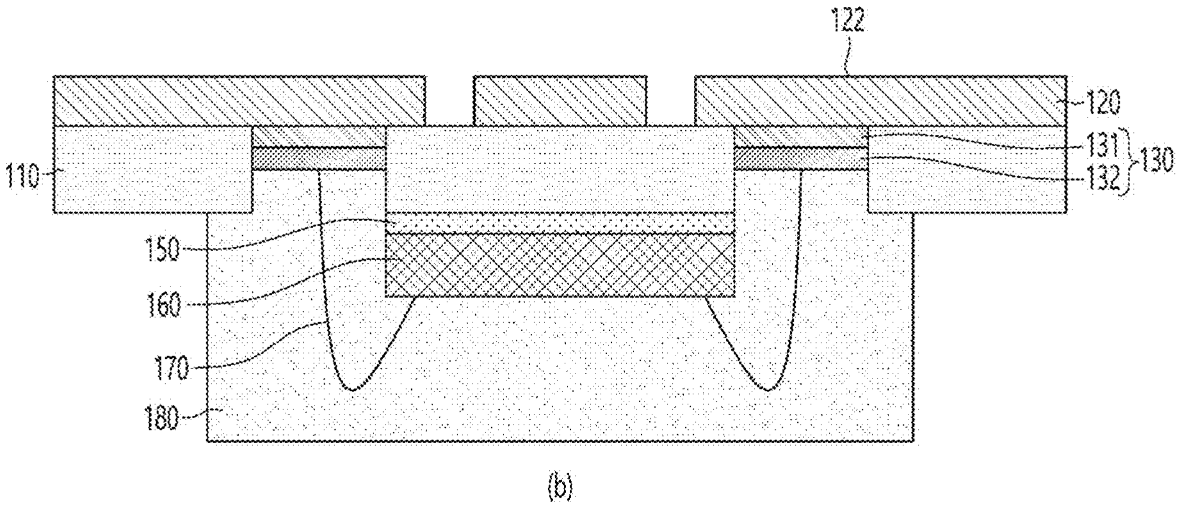

FIGS. 2(*a*) and 2(*b*) are views showing a circuit board and a chip package according to a first embodiment. For example, FIG. 2(*a*) shows a circuit board according to the first embodiment, and FIG. 2(*b*) shows a chip package including the circuit board according to the first embodiment.

Referring to FIG. 2(*a*), the circuit board according to the first embodiment includes an insulating layer 110, a circuit pattern layer 120, and a surface treatment layer 130.

The insulating layer 110 may include an insulating material. For example, the insulating layer 110 may include any one insulating material of polyethylene terephthalate (PET), polycarbonate (PC), polyether sulfone (PES), polyimide (PI), or polymethyl methacrylate (PMMA). Alternatively, the insulating layer 110 may include a reel-type prepreg made of a glass fabric and an epoxy resin, but is not limited thereto.

The insulating layer 110 may have a thickness in a range of 60 μm to 120 μm. For example, the insulating layer 110 may have a thickness in a range of 70 μm to 110 μm. For example, the insulating layer 110 may have a thickness in a range of 80 μm to 100 μm.

When the thickness of the insulating layer 110 is less than 60 μm, the rigidity of the circuit board may be weakened, and accordingly, the bending characteristic of the circuit board may be deteriorated. When the thickness of the insulating layer 110 is less than 60 μm, the circuit pattern layer 120 may not be stably formed on the insulating layer 110. For example, when the thickness of the insulating layer 110 is less than 60 μm, process characteristics in the process of forming the circuit pattern layer 120 may be deteriorated.

When the thickness of the insulating layer 110 exceeds 120 μm, the overall thickness of the circuit board may increase, and accordingly, the thickness of the chip package may increase.

The insulating layer 110 may include at least one through hole 115. The through hole 115 may pass through upper and lower surfaces of the insulating layer 110. The through hole 115 may be formed by any one of processing methods, such as mechanical, laser, and chemical processing. When the through hole 115 is formed by machining, methods such as milling, drilling, and routing may be used. When the through hole 115 is formed by laser processing, a UV or CO2 laser method may be used. When the through hole 115 is formed by chemical processing, chemicals including amino silane, ketones, and the like may be used.

A circuit pattern layer 120 is formed on the insulating layer 110. The circuit pattern layer 120 may be formed on a first surface or an upper surface of the insulating layer 110.

The circuit pattern layer 120 is an alloy layer. For example, the circuit pattern layer 120 is formed of an alloy containing nickel (Ni) or iron (Fe) as a main component.

The circuit pattern layer 120 has a thickness in a range of 20 μm to 50 μm. For example, the circuit pattern layer 120 has a thickness in a range of 25 μm to 45 μm. For example, the circuit pattern layer 120 has a thickness in a range of 30 μm to 40 μm. When the thickness of the circuit pattern layer 120 is less than 20 μm, the resistance value of the circuit pattern layer 120 may increase, and thus signal loss may increase. For example, when the thickness of the circuit pattern layer 120 is less than 20 μm, signal transmission characteristics of the circuit board may be deteriorated. When the thickness of the circuit pattern layer 120 exceeds 50 μm, it is difficult to miniaturize the circuit pattern layer 120, and thus circuit integration may decrease. When thickness of the circuit pattern layer 120 may exceed 50 μm, the thickness of the circuit pattern layer 120 may increase, and thus the overall thickness of the circuit board may increase.

At this time, the surface treatment layer formed on at least one of the bonding portion and the contact portion of the circuit pattern layer 120 may be omitted or removed while the thickness of the circuit pattern layer 120 of the embodiment is 50 μm or less. This may be achieved by the properties of the alloy constituting the circuit pattern layer 220, which will be described below.

That is, the circuit pattern layer 120 of the first embodiment may be formed of a first alloy containing nickel (Ni) as a main component. Specifically, the circuit pattern layer 120 may be formed of the first alloy of a nickel (Ni)-chromium (Cr)-iron (Fe) alloy containing chromium (Cr) and iron (Fe) in nickel (Ni) as a main component.

Alternatively, the circuit pattern layer 120 of the second embodiment may be formed of a second alloy containing iron (Fe) as a main component. Specifically, the circuit pattern layer 120 may be formed of the second alloy of an iron (Fe)-chromium (Cr)-nickel (Ni) alloy containing chromium (Cr) and nickel (Ni) in iron (Fe) as a main component.

Here, the main component means a metal having a highest wt % among a plurality of metals constituting the alloy.

The circuit pattern layer 120 includes a bonding portion 121 and a contact portion 122. The bonding portion 121 of the circuit pattern layer 120 refers to a region connected to the IC chip 160 in the chip package. For example, the bonding portion 121 of the circuit pattern layer 120 may mean a region on the lower surface of the circuit pattern layer 120 that vertically overlaps the through hole 115.

In addition, the contact portion 122 of the circuit pattern layer 120 may refer to an outermost region on the circuit board and the chip package. For example, the contact portion 122 of the circuit pattern layer 120 may mean a region exposed to an outside in the circuit board and the chip package. The contact portion 122 of the circuit pattern layer 120 may mean an upper surface of the circuit pattern layer 120.

That is, a lower surface of the circuit pattern layer 120 that vertically overlaps with the through hole 115 of the insulating layer 110 functions as a bonding portion 121, and an upper surface of the circuit pattern layer 120 functions as a contact portion 122.

In this case, the circuit pattern layer 120 is required to have wire bonding property, corrosion resistance, oxidation resistance, abrasion resistance, and hardness of a certain level or more. For example, the bonding portion 121 of the circuit pattern layer 120 is required to have wire bonding property of a certain level or more. In addition, the contact portion 122 of the circuit pattern layer 120 is required to have corrosion resistance, oxidation resistance, abrasion resistance, and hardness of a certain level or more.

Accordingly, the first surface treatment layer 30 of the comparative example was formed on the bonding portion of the circuit pattern layer, and the second surface treatment layer 40 of the comparative example was formed on the contact portion of the circuit pattern layer.

Alternatively, the circuit pattern layer 120 of the embodiment is formed using an alloy having corrosion resistance, oxidation resistance, abrasion resistance, and hardness of a certain level or more. Through this, the embodiment allows to omit or remove the surface treatment layer to be formed on the contact portion 122 of the circuit pattern layer 120.

That is, in the embodiment, the circuit pattern layer 120 itself has corrosion resistance, oxidation resistance, abrasion resistance, and hardness of a certain level or more without the second surface treatment layer. This may be achieved by the types and contents of metals constituting the circuit pattern layer 120 to be described below.

Hereinafter, composition ratios of metals in the alloy constituting the circuit pattern layer 120 according to the first and second embodiments will be described.

In this case, the circuit pattern layer 120 may be formed of any one of the first alloy and the second alloy.

The first alloy refers to a nickel (Ni)-chromium (Cr)-iron (Fe) alloy containing nickel (Ni) as a main component. In addition, the second alloy refers to an iron (Fe)-chromium (Cr)-nickel (Ni) alloy containing iron (Fe) as a main component.

The circuit pattern layer 120 formed of any one alloy of the first alloy and the second alloy in the embodiment may have a resistance value in the range of 0.07Ω to 0.35Ω. In addition, the circuit pattern layer 120 formed of any one alloy of the first alloy and the second alloy in the embodiment may have an etching rate (μm/min) between 30 μm/min and 70 μm/min. In addition, the circuit pattern layer 120 formed of any one alloy of the first alloy and the second alloy in the embodiment may have a surface roughness change rate of 0.2% to 6.0%. In addition, the circuit pattern layer 120 formed of any one alloy of the first alloy and the second alloy in the embodiment may have wire bonding property of 4 gf or more. In addition, the circuit pattern layer 120 formed of any one alloy of the first alloy and the second alloy in the embodiment may have a nickel elution amount of 0.28 μg/cm$^2$/week or less, and furthermore, eluted nickel may not be detected. In addition, the circuit pattern layer 120 formed of any one of the first alloy and the second alloy in the embodiment may have a plating adhesion of 5B or more. This may be achieved by the content of metals constituting the first alloy and the content of metals constituting the second alloy, which will be described below. This will be described in detail.

—First Alloy (Nickel (Ni)-Chromium (Cr)-Iron (Fe) Alloy)—

The circuit pattern layer 120 in the first embodiment is formed of a nickel (Ni)-chromium (Cr)-iron (Fe) alloy (hereinafter, referred to as a 'first alloy') containing nickel (Ni) as a main component. The first alloy has corrosion resistance, oxidation resistance, abrasion resistance, and hardness of a certain level of more. Through this, when the circuit pattern layer 120 is formed of the first alloy of the first embodiment, the second surface treatment layer to be formed on the contact portion 122 of the circuit pattern layer 120 can be omitted or removed.

That is, the first alloy forming the circuit pattern layer 120 includes nickel (Ni) as a main component. For example, a content of nickel (Ni) in the first alloy constituting the circuit pattern layer 120 satisfies the range of 60 wt % to 80 wt %. For example, the content of nickel (Ni) in the first alloy may satisfy a range of 65 wt % to 78 wt %. For example, the content of nickel (Ni) in the first alloy may satisfy the range of 70 wt % to 75 wt %.

When the content of nickel (Ni) in the first alloy is less than 60 wt %, corrosion resistance, oxidation resistance, abrasion resistance, and hardness of the circuit pattern layer 120 may decrease. Accordingly, the second surface treatment layer must be essentially formed on the contact portion 122 of the circuit pattern layer 120, thereby, the manufacturing process may become complicated, the thickness of a circuit board may increase, and manufacturing cost may increase.

Specifically, when the content of nickel (Ni) in the first alloy is less than 60 wt %, the surface roughness change rate (%) of the circuit pattern layer 120 may exceed 10%. The surface roughness change rate (%) is related to corrosion resistance, oxidation resistance, and abrasion resistance of the circuit pattern layer 120.

The surface roughness change rate (%) may be confirmed by measuring a change in surface roughness of the first alloy that changes as salt water is sprayed on a surface of the first alloy. That is, a first surface roughness value of the surface of the first alloy is measured before the salt spray, and a second surface roughness value of the surface of the first alloy that is changed after the salt spray is measured. In addition, the surface roughness change rate (%) may be calculated using a difference between the first surface roughness value and the second surface roughness value. And, when the surface roughness change rate (%) exceeds 10%, a problem occurs in corrosion resistance, oxidation resistance and abrasion resistance of the circuit pattern layer 120 formed of the first alloy, and through this, the second surface treatment layer must be essentially formed on the contact portion 122 of the circuit pattern layer 120. In this case, the content of nickel (Ni) in the first alloy constituting the circuit pattern layer 120 in the embodiment is in the range of 60 wt % to 80 wt %. Accordingly, the surface roughness change rate (%) in the embodiment may be 10% or less, preferably 8% or less, and more preferably 5% or less.

In addition, when the content of nickel (Ni) in the first alloy exceeds 80 wt %, the etching rate (μm/min) in the process of forming the circuit pattern layer 120 using the first alloy may be decreased. That is, when the content of nickel (Ni) in the first alloy exceeds 80 wt %, since the hardness of the first alloy is too high, the etching rate (μm/min) in a certain range may not come out in the process of forming the circuit pattern layer 120. The etching rate (μm/min) refers to a degree of etching (e.g., the degree of sharpening) when the etching of the first alloy is performed using an etching solution for 1 minute. That is, when the content of nickel (Ni) in the first alloy exceeds 80 wt %, the etching rate (μm/min) in the process of etching the circuit pattern layer 120 is decreased to 10 μm/min or less. Accordingly, process characteristics of the circuit board may be deteriorated (e.g., a time required to etch the circuit pattern layer may be increased).

In addition, when the content of nickel (Ni) in the first alloy exceeds 80 wt %, nickel ions may be eluted to the surface of the circuit pattern layer 120 formed of the first alloy. That is, when the content of nickel (Ni) in the first alloy exceeds 80 wt %, the effect of inhibiting the elution of nickel ions by chromium (Cr), which will be described below, may be decreased. In addition, reliability problems may occur due to the eluting of nickel ions to the surface of the circuit pattern layer 120. A description related to the elution of the nickel ions will be described in more detail below.

In addition, when the content of nickel (Ni) in the first alloy is less than 60 wt % or exceeds 80 wt %, the content of other metals (e.g., chromium or iron) is decreased or increased. Accordingly, a problem occurs in that the content of the other metal does not satisfy the range described below.

Meanwhile, a content of chromium (Cr) in the first alloy constituting the circuit pattern layer 120 satisfies the range of 10 wt % to 22 wt %. For example, the content of chromium (Cr) in the first alloy satisfies the range of 11 wt % to 21 wt %. For example, the content of chromium (Cr) in the first alloy satisfies the range of 12 wt % to 18 wt %.

When the content of chromium (Cr) in the first alloy is less than 10 wt %, the amount of nickel elution to the surface of the circuit pattern layer 120 formed of the first alloy may increase.

That is, the surface treatment layer is not formed on the contact portion 122 of the circuit pattern layer 120 in the embodiment. Accordingly, the contact portion 122 of the circuit pattern layer 120 in the embodiment is exposed to the outside. Specifically, the contact portion 122 of the circuit pattern layer 120 is exposed to the user in the use environment of the application to which the circuit board and the chip package of the embodiment are applied. In this case, when nickel ions are eluted from the circuit pattern layer 120 to the outside, a reliability problem occurs. Specifically, when the nickel ions are eluted to the outside, it causes problems such as inducing skin allergy in the user. Accordingly, as in the embodiment, when the surface treatment layer is removed from the contact portion of the circuit pattern layer 120 while forming the circuit pattern layer 120 with an alloy containing nickel (Ni), the nickel ions should not be eluted to the surface of the circuit pattern layer 120. In this case, an ionization energy of the chromium (Cr) is smaller than an ionization energy of the nickel (Ni). Accordingly, when metal ions constituting the first alloy are eluted to the surface of the circuit pattern layer 120, the chromium ions are eluted before the nickel ions. In addition, it is possible to inhibit the nickel ions from eluting to the outside by eluting the chromium ions before the nickel ions. That is, the chromium (Cr) functions to inhibit the nickel (Ni) from eluting to the surface of the circuit pattern layer 120.

At this time, when the content of chromium (Cr) in the first alloy is less than 10 wt %, the effect of inhibiting the elution of nickel (Ni) by the chromium (Cr) is decreased. Thereby, a product reliability problem may occur due to the eluting of nickel ions to the outside. Accordingly, the first alloy constituting the circuit pattern layer 120 in the embodiment may contain chromium (Cr) in the content of 10 wt % or more.

On the other hand, when the content of chromium (Cr) in the first alloy exceeds 22 wt %, the hardness of the circuit pattern layer 120 increases, and thus the etching rate (μm/min) of the circuit pattern layer 120 may decrease. In addition, when the content of chromium (Cr) in the first alloy exceeds 22 wt %, the wire bonding property of the circuit pattern layer 120 may be deteriorated. And, when the wire bonding property of the circuit pattern layer 120 is decreased, the thickness of the surface treatment layer 130 formed on the bonding portion 121 of the circuit pattern layer 120 is increased (preferably increase the thickness of the gold (Au) metal layer), and accordingly, there is a problem in that the manufacturing cost increases. In addition, when the content of chromium (Cr) in the first alloy exceeds 22 wt %, the rollability of the first alloy is decreased, and accordingly the thickness of the first alloy, furthermore, the thickness of the circuit pattern layer 120 may be thicker.

In addition, when the content of chromium (Cr) in the first alloy is less than 10 wt % or exceeds 22 wt %, the content of the other metal (e.g., nickel or iron) is decreased or increased by the corresponding amount, and this causes a problem in that the content of the other metal does not satisfy the optimal range described herein.

Meanwhile, a content of iron (Fe) in the first alloy constituting the circuit pattern layer 120 satisfies the range of 3 wt % to 20 wt %. For example, the content of iron (Fe) in the first alloy satisfies the range of 5 wt % to 15 wt %. For example, the content of iron (Fe) in the first alloy satisfies the range of 7 wt % to 11 wt %.

In the first embodiment, the iron (Fe) functions to improve the rollability (or ductility) of the first alloy composed of the nickel (Ni)-chromium (Cr)-iron (Fe).

At this time, when the content of iron (Fe) in the first alloy is less than 3 wt %, the rollability of the first alloy is decreased, and accordingly, it may be difficult to manufacture the thickness of the first alloy, furthermore, the thickness of the circuit pattern layer 120 to 50 μm or less.

In addition, when the content of iron (Fe) in the first alloy exceeds 20 wt %, the content of nickel (Ni) or the content of iron (Fe) is decreased, and accordingly, an increase in the amount of nickel elution or a change in surface roughness (%) may increase.

In addition, when the content of iron (Fe) in the first alloy is less than 3 wt % or exceeds 20 wt %, the content of other metals (e.g., nickel or chromium) is decreased or increases, and this causes a problem in that the content of the other metal does not satisfy the optimal range described herein.

Meanwhile, the optimum range for the composition ratio of nickel (Ni), chromium (Cr), and iron (Fe) in the first alloy may be as follows.

Nickel (Ni) content: 70 wt % to 75 wt %

Chromium (Cr) content: 12 wt % to 18 wt %

Iron (Fe) content: 7 wt % to 11 wt %

And, when the first alloy in the first embodiment is manufactured with a composition ratio corresponding to the above optimal range, it was confirmed that the state of the first alloy, such as resistance, etching rate, surface roughness change rate, nickel elution amount, rolling thickness, and plating film adhesion, had optimal characteristics.

At least one additive may be included in the first alloy 120 constituting the circuit pattern layer 120. For example, the first alloy may include an additive of any one of molybdenum (Mo), manganese (Mn), and a molybdenum (Mo)-manganese (Mn) alloy. Any one of the molybdenum (Mo), manganese (Mn) and molybdenum (Mo)-manganese (Mn) alloy may be added to achieve solid solution strengthening by refining the structure of the first alloy constituting the circuit pattern layer 120.

In the first alloy, the content of any one of molybdenum (Mo), manganese (Mn), and molybdenum (Mo)-manganese (Mn) alloy satisfies the range of 1 wt % to 5 wt %.

That is, when the content of the additive including any one of molybdenum (Mo), manganese (Mn) and molybdenum (Mo)-manganese (Mn) alloy is less than 1 wt %, the solid solution strengthening effect is insufficient, and accordingly, abrasion resistance, oxidation resistance, and corrosion resistance of the circuit pattern layer 120 may be deteriorated. Specifically, when the content of the additive including any one of molybdenum (Mo), manganese (Mn) and molybdenum (Mo)-manganese (Mn) alloy is less than 1 wt %, the metallic elements of nickel (Ni), chromium (Cr), and iron (Fe) may not mix well with each other in the process of manufacturing the first alloy using the nickel (Ni)-chromium (Cr)-iron (Fe). Accordingly, the first alloy may not have a stable crystal structure. Specifically, when the content of the additive including any one of molybdenum (Mo), manganese (Mn) and molybdenum (Mo)-manganese (Mn) alloy is less than 1 wt %, it is difficult to refine the metal elements in the first alloy including nickel (Ni)-chromium (Cr)-iron (Fe). Thereby, the solid solution characteristic is decreased. In addition, a problem in which the crystal phase of the first alloy increases (e.g., it is difficult to refine the crystal phase) may occur.

In addition, when the content of the additive including any one of molybdenum (Mo), manganese (Mn), and a molybdenum (Mo)-manganese (Mn) alloy exceeds 5 wt %, the resistance characteristic of the circuit pattern layer 120 increases, and thus signal loss may increase.

In addition, when the content of the additive including any one of molybdenum (Mo), manganese (Mn) and molybdenum (Mo)-manganese (Mn) alloy exceeds 5 wt %, the hardness of the circuit pattern layer 120 is increase, and thus the etching rate (μm/min) may decrease.

That is, in the embodiment, an additive including any one of molybdenum (Mo), manganese (Mn) and molybdenum (Mo)-manganese (Mn) alloy is added. Thereby, the complete solid solution effect of the first alloy can be achieved. In addition, by suppressing the generation of the secondary crystal phase of the first alloy, it is possible to improve matching with gold (Au). Furthermore, corrosion of the circuit pattern layer 120 may be improved by forming a surface film.

—Characteristics of the First Alloy (Nickel (Ni)-Chromium (Cr)-Iron (Fe) Alloy)—

Hereinafter, an experimental example of the characteristics of the first alloy containing nickel (Ni) as a main component according to the first embodiment will be described.

Table 1 shows the properties of the metal of the comparative example and the first alloy according to the first embodiment.

TABLE 1

| division | | comparative example 1(pure Cu) | comparative example 2 (copper-nickel-iron alloy) | nickel (Ni)-chromium (Cr)-iron (Fe) alloy Experiment example 1 | Experiment example 2 | Experiment example 3 |
|---|---|---|---|---|---|---|
| composition content (wt. %) | Cu | 100 wt % | 32 | — | — | — |
| | Ni | — | 64 | 73 | 60 | 56 |
| | Cr | — | — | 16 | 23 | 21 |
| | Fe | — | 2 | 9 | 14 | 3 |
| | etc.(Mo or Mn or Mo—Mn alloy) | — | 2 | 2 | 3 | 14 |
| Material properties | resistance (Ω) | 0.081 | 0.071 | 0.091 | 0.091 | 0.092 |
| | etching rate(μm/min) | 63 | 43 | 48 | 61 | 0 |
| | surface roughness change rate (%) (salt spray) | 25.0 | 0.9 | 4.5 | 3.4 | 2.0 |
| Nickel dissolution test | detection amount (um/cm$^2$/Week) | N.D (With surface treatment layer) | 12.36 | N.D | N.D | N.D |
| | Judgment | Pass | fail | Pass | Pass | Pass |
| rolling thickness (μm) | | 35 | 30 | 25 | — | Unable to manufacture |
| Plating film adhesion | | — | 5B | 5B | 5B | — |
| Wire bonding property (gf) | | 6 | 2 | 4 | 1 | — |
| result | | NG | NG | OK | NG | NG |

Referring to Table 1, a circuit pattern layer in the comparative example was formed using a metal layer including pure copper. And, when the circuit pattern layer was formed using a metal layer containing pure copper, the resistance (Ω) of the circuit pattern layer had a level of 0.081, and the etching rate (μm/min) had a level of 63, the surface roughness change rate (%, the state in which the surface treatment layer was removed) had a level of 25. Accordingly, the surface treatment had to be essentially formed in the contact portion of the circuit pattern layer.

In addition, the characteristics of the first alloy in the first embodiment were confirmed by the change in the content of each metal constituting the first alloy.

Comparative Example 2 in Table 1 shows nickel (Ni)-copper (Cu)-iron (Fe) alloy in which copper (Cu) is added instead of chromium (Cr) in nickel (Ni)-chromium (Cr)-iron (Fe) constituting the first alloy. That is, the alloy in Comparative Example 2 means that the content of chromium (Cr) in the first alloy is out of the range described above. And, when the first alloy contains less than a predetermined content of chromium (Cr) or contains copper (Cu) instead of chromium (Cr), it was confirmed that it did not inhibit the nickel (Ni) contained in the first alloy from eluting to the surface. Accordingly, it was confirmed that nickel in an amount of 12.36 um/cm$^2$/Week was eluted to the surface of the circuit pattern layer.

At this time, the nickel elution amount is a measure of the amount of nickel eluted after dipping the alloy in artificial sweat for a week.

And, a nickel elution amount of 12.36 μg/cm$^2$/Week in Comparative Example 2 was measured in an area of 28.67 cm$^2$, and a nickel elution amount of 2.27 μg/cm$^2$/Week was measured in an area of 2.27 cm$^2$.

Experimental Example 1 of the table 1 shows a case in which the composition ratio of the first alloy composed of nickel (Ni)-chromium (Cr)-iron (Fe) containing nickel (Ni) as a main component has a content within the range described in the first embodiment. That is, Experimental Example 1 means the first alloy in the first embodiment. The first alloy of the first embodiment is nickel (Ni) in a content of 60 wt % to 80 wt %, chromium (Cr) in a content of 10 wt % to 22 wt %, iron (Fe) in a content of 3 wt % to 20 wt %, and an additive (any one of molybdenum (Mo), manganese (Mn) and molybdenum (Mo)-manganese (Mn) alloy) in a content of 1 wt % to 5 wt %. And, as shown in Table 1, in Experimental Example 1, it was confirmed that the resistance (Ω) had a level of 0.091, it was confirmed that the etching rate (μm/min) was about 48, it was confirmed that the surface roughness change rate (%) was 4.5 level, it was confirmed that nickel eluted to the surface of the first alloy was not detected (N.D, Non-Detect) in the nickel dissolution test. In addition, it was confirmed that the plating film adhesion was also in the best state at the level of 5B. Here, the plating film adhesion is measured based on an ASTM D3359 standard, and the result values include 5B and 4B. Here, 5B means that the peeling degree is 0%, and 4B means that the peeling degree has a range of more than 0% and less than 5%.

The method of measuring the plating film adhesion is as follows. 1) The circuit pattern layer is patterned (for example, to form a sheath) in 10 lines at intervals of 1 mm in the horizontal direction and 10 lines in the vertical direction to make a total of 100 patterns. 2) A tape for reliability test is attached on the 100 patterns. 3) When the tape is removed, the number of patterns removed together with the tape is measured. And, 5B means that the number of patterns removed together with the tape is 0. And, 4B means that the number of patterns to be removed is one or more and less than five.

On the other hand, Experimental Example 2 is an alloy in which the content of chromium (Cr) in the nickel (Ni)-chromium (Cr)-iron (Fe) alloy of Experimental Example 1 exceeds the above-described range (for example, the content of chromium is 23 wt % or more). And, in the case of the alloy as in Experimental Example 2, it was confirmed that the overall material properties had a good state. However, in Experimental Example 2, it was confirmed that a problem occurred in the rollability due to an excessive increase in strength, thereby causing a problem in which an alloy could not be manufactured by a rolling method (a problem occurred in the rolling thickness).

On the other hand, Experimental Example 3 is an alloy to which an additive of 6 wt % or more (specifically, 14 wt %) is added in the first alloy containing nickel (Ni)-chromium (Cr)-iron (Fe) of Experimental Example 1. And, it was confirmed that Experimental Example 3 had good resistance (Ω), surface roughness change rate (%), plating film adhesion, and nickel elution amount. However, it could be confirmed that the etching rate (μm/min) appeared as 0, and accordingly, it was confirmed that the production was impossible (e.g., the production of a rolled alloy was impossible or the etching of the circuit pattern layer was impossible). Accordingly, in the embodiment, the circuit pattern layer 120 using a first alloy including nickel (Ni), chromium (Cr), iron (Fe) and an additive having the same content range as in Experimental Examples 1 and 2 can be manufactured.

In addition, although not described in Table 1, in the first alloy, when the content of nickel (Ni) is less than 60 wt %, it was confirmed that it is difficult to manufacture the rolled thickness of the first alloy to 50 μm or less or the production of the first alloy itself was impossible.

In conclusion, when the content of at least one metal among nickel (Ni), chromium (Cr) and iron (Fe) in the first alloy does not satisfy the above-described range, the content of at least one metal is increased by this must increase or decrease. Accordingly, it was confirmed that the production of the first alloy itself was impossible or that the properties of the first alloy did not satisfy the optimal target range.

In conclusion, when the circuit pattern layer 120 is formed of the first alloy having the composition ratio in the above-described range in the first embodiment, it was confirmed to have the resistance value in the range of 0.07Ω to 0.35Ω, an etching rate (μm/min) between 30 μm/min and 70 μm/min, the surface roughness change rate between 0.2% and 6.0%, the wire bonding property of 4 gf or more, the nickel elution amount of 0.28 $\mu g/cm^2$/week or less, and the plating adhesion of 5B or more.

Through this, in the first embodiment, the surface treatment layer to be disposed on the contact portion 122 of the circuit pattern layer 120 can be removed, thereby simplifying the manufacturing process and reducing the manufacturing cost.

On the other hand, as shown in Table 1, it was confirmed that the wire bonding property of the bonding portion of the circuit pattern layer 120 of the first embodiment has a 4 gf level. In this case, the wire bonding property of the circuit pattern layer 120 should be 4 gf or more. And, it was confirmed that the wire bonding property of the circuit pattern layer 120 of the embodiment satisfies the specification.

Accordingly, in the first embodiment, the surface treatment layer to be formed on the bonding portion 121 of the circuit pattern layer 120 may be omitted.

However, when the wire bonding property of the circuit pattern layer 120 is 4 gf, the wire bonding reliability may be deteriorated depending on the capability (or process deviation) of the wire bonding process equipment.

Accordingly, in the embodiment, the surface treatment layer 130 may be formed on the bonding portion 121 of the circuit pattern layer 120.

The surface treatment layer 130 is disposed on the lower surface (i.e., the bonding portion 121) of the circuit pattern layer 120 vertically overlapping the through hole 115 of the insulating layer 110. That is, the surface treatment layer 130 is disposed in the through hole 115.

At this time, in an embodiment, the surface treatment layer 130 is composed of a plurality of layers.

For example, the surface treatment layer 130 may include a first metal layer 131 including nickel and a second metal layer 132 including gold (Au).

Accordingly, the embodiment can improve wire bonding property by forming the surface treatment layer 130 on the bonding portion 121 of the circuit pattern layer 120, and accordingly, connectivity with the IC chip 160 may be improved.

Meanwhile, as shown in FIG. 2(*b*), a first adhesive layer 150 is formed on the lower surface of the insulating layer 110. The first adhesive layer 150 is for bonding the IC chip 160 to the lower surface of the insulating layer 110. The first adhesive layer 150 may be an epoxy, a thermosetting adhesive, an ultraviolet adhesive, or the like, but is not limited thereto.

In addition, the IC chip 160 is attached to the first adhesive layer 150. In addition, the IC chip 160 is electrically connected to the bonding portion 121 of the circuit pattern layer 120 through a connection member 170 such as a wire. Specifically, the connection member 170 may electrically connect a terminal (not shown) of the IC chip 160 and the surface treatment layer 130.

Meanwhile, the chip package includes the molding layer 180. The molding layer 180 may be an epoxy molding compound (EMC), but is not limited thereto. The molding layer 180 is disposed on the lower surface of the insulating layer 110. The molding layer 180 may mold the IC chip 160 and the connection member 170.

Meanwhile, the circuit pattern layer 120 of the first embodiment is formed of a nickel (Ni)-chromium (Cr)-iron (Fe) alloy containing nickel as a main component.

Alternatively, the circuit pattern layer 120 of the second embodiment may be formed of a second alloy corresponding to an iron (Fe)-chromium (Cr)-nickel (Ni) alloy containing iron (Fe) as a main component. Hereinafter, a second alloy corresponding to the iron (Fe)-chromium (Cr)-nickel (Ni) alloy according to the second embodiment constituting the circuit pattern layer 120 will be described.

—Second Alloy (Iron (Fe)-Chromium (Cr)-Nickel (Ni) Alloy)—

The circuit pattern layer 120 of the second embodiment is formed of a second alloy containing iron (Fe) as a main component. The second alloy has corrosion resistance, oxidation resistance, abrasion resistance and hardness of a certain level or more. Through this, when the circuit pattern layer 120 is formed using the second alloy, the second surface treatment layer to be formed on the contact portion 122 of the circuit pattern layer 120 may be omitted or removed.

That is, the second alloy constituting the circuit pattern layer 120 has iron (Fe) as a main component. For example, a content of iron (Fe) in the second alloy satisfies the range of 60 wt % to 80 wt %. For example, the content of iron (Fe) in the second alloy may satisfy the range of 61 wt % to 78 wt %. For example, the content of iron (Fe) in the second alloy may satisfy the range of 63 wt % to 75 wt %. That is, the optimal range of the content of iron (Fe) in the second alloy may be 63 wt % to 75 wt %.

When the content of iron (Fe) in the second alloy is less than 60 wt %, the rollability of the second alloy is decreased, and accordingly, the thickness of the second alloy increases, and further, the thickness of the circuit pattern layer 120 increases.

When the content of iron (Fe) in the second alloy exceeds 80 wt %, abrasion resistance, corrosion resistance, and oxidation resistance of the circuit pattern layer 120 formed of the second alloy may decrease.

In addition, when the content of iron (Fe) in the second alloy exceeds 80 wt %, the resistance (Ω) of the circuit pattern layer 120 formed of the second alloy increases, and thus signal transmission loss increases.

In addition, when the content of iron (Fe) in the second alloy is less than 60 wt % or exceeds 80 wt %, the content of other metals (e.g., nickel or chromium) is decreased or increases, and this causes a problem in that the content of the other metal does not satisfy the optimal range described herein.

On the other hand, a content of chromium (Cr) in the second alloy satisfies the range of 10 wt % to 22 wt %. For example, the content of chromium (Cr) in the second alloy satisfies the range of 13 wt % to 21 wt %. For example, the content of chromium (Cr) in the circuit pattern layer 120 satisfies the range of 15 wt % to 20 wt %. That is, the optimal range of the content of chromium (Cr) in the second alloy may be 15 wt % to 20 wt %.

When the content of chromium (Cr) in the second alloy is less than 10 wt %, the amount of nickel elution to the surface of the second alloy may increase.

In addition, when the content of chromium (Cr) in the second alloy is less than 10 wt %, the hardness of the circuit pattern layer 120 formed of the second alloy is decreased, and thus oxidation resistance, abrasion resistance and corrosion resistance are decreased.

On the other hand, when the content of chromium (Cr) in the second alloy exceeds 22 wt %, the hardness of the second alloy increases, and accordingly, the etching rate (μm/min) in the etching process of forming the circuit pattern layer 120 using the second alloy may be decreased. In addition, when the content of chromium (Cr) of the second alloy exceeds 22 wt %, the wire bonding property may be deteriorated. And, when the wire bonding property of the circuit pattern layer 120 is decreased, the thickness of the surface treatment layer 130 formed on the bonding portion 121 of the circuit pattern layer 120 increases, and accordingly, there is a problem in that the manufacturing cost increases. In addition, when the content of chromium (Cr) in the circuit pattern layer 120 exceeds 22 wt %, the rollability of the second alloy is decreased, and thus the thickness of the second alloy, furthermore, the circuit pattern layer 120 may be thicker.

In addition, when the content of chromium (Cr) in the second alloy is less than 10 wt % or exceeds 22 wt %, the content of other metals (e.g., nickel or iron) is decreased or increases, and this causes a problem in that the content of the other metal does not satisfy the optimal range described herein.

Meanwhile, the content of nickel (Ni) in the second alloy satisfies the range of 3 wt % to 20 wt %. For example, the content of nickel (Ni) in the second alloy satisfies the range of 5 wt % to 18 wt %. For example, the content of nickel (Ni) in the second alloy satisfies the range of 7 wt % to 15 wt %. That is, the optimal range of the content of nickel (Ni) in the second alloy may be 7 wt % to 15 wt %.

When the content of nickel (Ni) in the second alloy is less than 3 wt %, the surface roughness change rate (%) of the circuit pattern layer 120 may exceed 10%.

In addition, when the content of nickel (Ni) in the second alloy exceeds 20 wt %, the etching rate (μm/min) in the etching process of forming the circuit pattern layer 120 using the second alloy can be decreased.

In addition, when the content of nickel (Ni) in the second alloy is less than 3 wt % or exceeds 20 wt %, the content of other metals (e.g., iron or chromium) is decreased or increases, and this causes a problem in that the content of the other metal does not satisfy the optimal range described herein.

Meanwhile, at least one additive may be selectively included in the second alloy.

At this time, the additive was essentially included in the first alloy including nickel (Ni)-chromium (Cr)-iron (Fe) in the first embodiment.

Unlike the first alloy, the second alloy including iron (Fe)-chromium (Cr)-nickel (Ni) in the second embodiment has iron (Fe) as a main component. Accordingly, the second alloy may selectively include any one additive of molybdenum (Mo), manganese (Mn) and molybdenum (Mo)-manganese (Mn) alloy. For example, the molybdenum or manganese may be omitted in the second alloy. For example, an additive of any one of molybdenum (Mo), manganese (Mn), and molybdenum (Mo)-manganese (Mn) alloy may be added to the second alloy in a range of 0 wt % to 5 wt %. For example, even if the additive is not included in the second alloy, it is possible to refine the metal elements of the iron (Fe)-chromium (Cr)-nickel (Ni), and accordingly, it is possible to achieve the effect of strengthening employment.

In conclusion, the optimum range for the composition ratio of iron (Fe), chromium (Cr), and nickel (Ni) in the second alloy may be as follows.

Iron (Fe) content: 63 wt % to 75 wt %

Chromium (Cr) content: 15 wt % to 20 wt %

Nickel (Ni) content: 7 wt % to 15 wt %

And, when the second alloy in the second embodiment is manufactured with a composition ratio corresponding to the above optimal range, it was confirmed that the state of the second alloy, such as resistance, etching rate, surface roughness change rate, nickel elution amount, rolling thickness, and plating film adhesion, had optimal characteristics.

—Characteristics of the Second Alloy (Iron (Fe)-Chromium (Cr)-Nickel (Ni) Alloy)—

Hereinafter, an experimental example of the characteristics of the second alloy containing iron (Fe) as a main component according to the second embodiment will be described.

Table 2 shows the properties of the second alloy according to the comparative example and the second embodiment.

TABLE 2

| division | | comparative example (pure Cu) | iron (Fe)-chromium (Cr)- nickel (Ni) Experiment example 1 | Experiment example 2 | Experiment example 3 |
|---|---|---|---|---|---|
| composition content (wt. %) | Cu | 100 wt % | — | — | — |
| | Ni | — | 9 | 13 | 36 |
| | Cr | — | 18 | 17 | — |
| | Fe | — | 73 | 65 | 64 |
| | Etc. (Mo or Mn or Mo—Mn alloy) | — | — | 5 | — |
| Material properties | resistance (Ω) | 0.081 | 0.315 | 0.224 | 0.116 |
| | etching rate(μm/min) | 63 | 35 | 34 | 28 |
| | surface roughness change rate (%) (salt spray) | 25.0 | 3.8 | 2.9 | NG(change over time) |
| Nickel dissolution test | detection amount (um/cm$^2$/Week) | N.D (With surface treatment layer) | N.D | N.D | N.D |
| | Judgment | Pass | Pass | Pass | Pass |
| rolling thickness (μm) | | 35 | 35 | 40 | — |
| Plating film adhesion | | — | 5B | 5B | 5B |
| Wire bonding property (gf) | | 6 | 4 | 4 | 1 |
| result | | NG | OK | OK | NG |

Referring to Table 2, a circuit pattern layer in the comparative example was formed using a metal layer including pure copper. And, when the circuit pattern layer was formed using a metal layer containing pure copper, the resistance (Ω) of the circuit pattern layer had a level of 0.081, and the etching rate (μm/min) had a level of 63, the surface roughness change rate (%, the state in which the surface treatment layer was removed) had a level of 25. Accordingly, the surface treatment had to be essentially formed in the contact portion of the circuit pattern layer.

In addition, the characteristics of the second alloy in the second embodiment were confirmed by the change in the content of each metal constituting the first second.

Experimental Example 1 refers to a second alloy including iron (Fe)-chromium (Cr)-nickel (Ni) containing the iron (Fe) in a content of 60 wt/% to 80 wt/%, the chromium (Cr) in a content of 10 wt/% to 22 wt/%, the nickel (Ni) in a content of 3 wt/% to 20 wt/% without the additives (any one of molybdenum (Mo), manganese (Mn) and molybdenum (Mo)-manganese (Mn) alloy).

In the case of Experimental Example 1, it was confirmed that the resistance (Ω) had a level of 0.315, it was confirmed that the etching rate (μm/min) was 35 level, and it was confirmed that the surface roughness change rate (%) was 3.8 level, it was confirmed that nickel was not detected (N.D, Non-Detect) in the nickel dissolution test, and the adhesion of the plating film was also confirmed to have the best state at the level of 5B.

Experimental Example 2 refers to a second alloy including iron (Fe)-chromium (Cr)-nickel (Ni) containing the iron (Fe) in a content of 60 wt % to 80 wt %, the chromium (Cr) in a content of 10 wt % to 22 wt %, the nickel (Ni) in a content of 3 wt % to 20 wt % and the additive (molybdenum (Mo) or manganese (Mn)) of 5 wt % or less.

And, in the case of Experimental Example 2, it was confirmed that the resistance (Ω) had a level of 0.224, it was confirmed that the etching rate (μm/min) had about 34, it was confirmed that the surface roughness change rate (%) was 2.9 level, and it was confirmed that nickel was not detected (N.D, Non-Detect) in the nickel dissolution test. In addition, the plating film adhesion was also confirmed to have the best state at the level of 5B.

In addition, Experimental Example 3 refers an alloy in which the content of nickel (Ni) or chromium (Cr) is out of the above range in the iron (Fe)-chromium (Cr)-nickel (Ni) alloy according to the second embodiment.

And, in the case of Experimental Example 3, it was confirmed that the overall material properties were in a good state, but it was confirmed that the corrosion resistance properties were decreased, and it could be confirmed that the change over time for the roughness of the surface of the alloy was confirmed.

In addition, although not described in Table 2 above, in the second alloy, when at least one metal among iron (Fe), chromium (Cr) and nickel (Ni) is out of the above-described range, thereby the content of at least one other metal must be increased or decreased. Thereby, it is difficult to manufacture the rolling thickness of the second alloy to 50 μm or less. In addition, it is impossible to manufacture the second alloy itself. In addition, the properties of the second alloy do not satisfy the optimum target range.

In conclusion, when the circuit pattern layer 120 is formed of second alloy having the composition ratio in the above-described range in the second embodiment, it was confirmed to have the resistance value in the range of 0.07Ω to 0.35Ω, an etching rate (μm/min) between 30 μm/min and 70 μm/min, the surface roughness change rate between 0.2% and 6.0%, the wire bonding property of 4 gf or more, the nickel elution amount of 0.28 μg/cm$^2$/week or less, and the plating adhesion of 5B or more.

As described above, the circuit pattern layer of the first and second embodiments is formed using a first alloy of nickel (Ni)-chromium (Cr)-iron (Fe) containing nickel (Ni) as a main component or a second alloy of iron (Fe)-chromium (Cr)-nickel (Ni) containing iron (Fe) as a main component. Through this, the embodiment may omit or remove the surface treatment layer to be formed on the contact portion of the circuit pattern layer. Accordingly, the manufacturing process of the circuit board may be simplified and manufacturing cost may be reduced.

Hereinafter, modifications of the circuit board according to the first and second embodiments will be described.

Variation Example

Figure 3A:
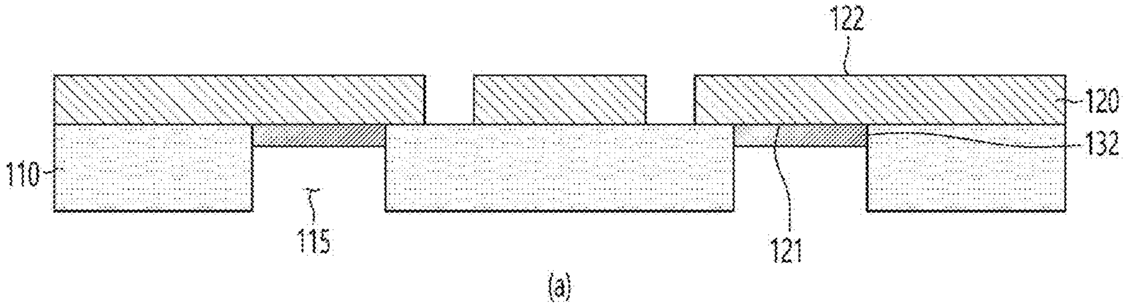
FIGS. 3(*a*) and 3(*b*) are views showing a first modified example of the circuit board and the chip package of FIGS. 2(*a*) and 2(*b*).
Figure 3B:
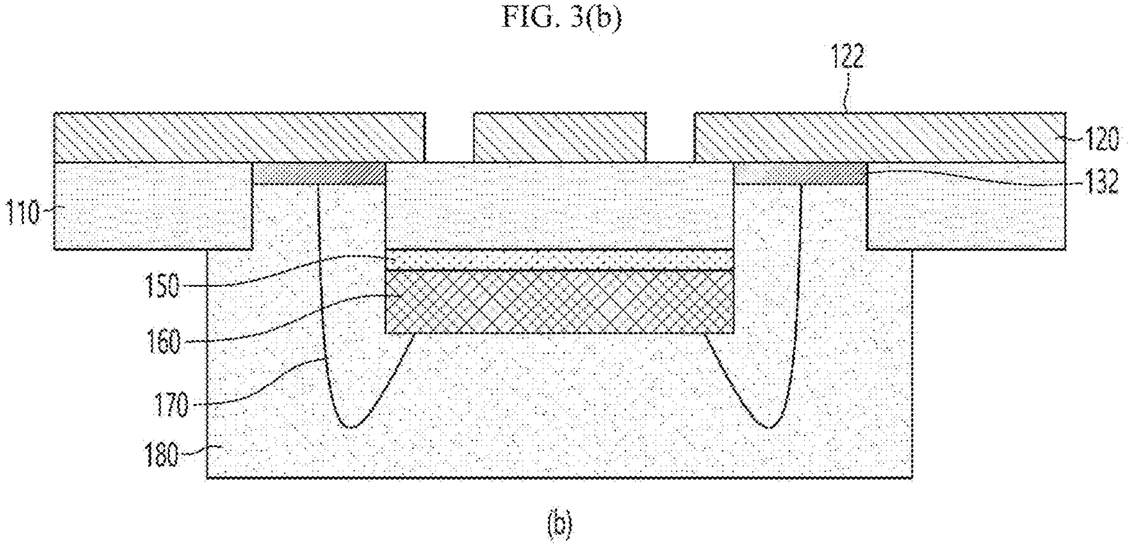

FIGS. 3(*a*) and 3(*b*) are views showing a first modified example of the circuit board and the chip package of FIGS. 2(*a*) and 2(*b*).

In FIGS. 2(*a*) and 2(*b*), the surface treatment layer 130 formed on the bonding portion 121 of the circuit pattern layer 120 includes the first metal layer 131 containing nickel and the second metal layer 132 containing gold.

The first metal layer 131 of the surface treatment layer 130 functions to inhibit copper (Cu) from being diffused into the second metal layer 132 while inhibiting oxidation of copper (Cu). In addition, the first metal layer 131 is formed to increase bonding strength between the copper (Cu) and gold (Au).

At this time, the circuit pattern layer 120 in the present application is formed of a first alloy of nickel (Ni)-chromium (Cr)-iron (Fe) containing nickel (Ni) as a main component, or iron (Fe)-chromium (Cr)-nickel (Ni) containing iron (Fe) as a main component. That is, the circuit pattern layer 120 does not include copper (Cu).

Through this, in the circuit board according to the embodiment, the surface treatment layer 130 disposed on the bonding portion 121 of the circuit pattern layer 120 may include only the second metal layer 132.

For example, in the circuit board of the first modification, the upper surface of the second metal layer 132 may directly contact the lower surface of the circuit pattern layer 120 (specifically, the bonding portion 121 of the circuit pattern layer 120). Through this, in the embodiment, the number of layers constituting the surface treatment layer 130 may be reduced. Specifically, in the embodiment, it is possible to remove the first metal layer 131 including nickel from the surface treatment layer 130 disposed on the bonding portion 121 of the circuit pattern layer 120, and accordingly, it is possible to achieve simplification of the manufacturing process and reduction of manufacturing cost according to the reduction in the number of layers of the surface treatment layer 130.

Figure 4A:
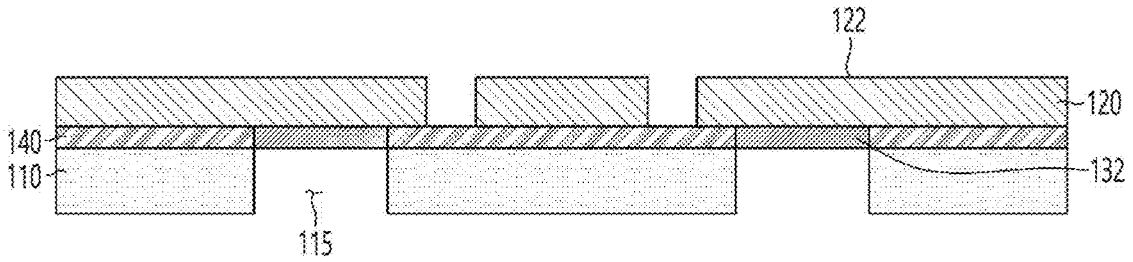
FIGS. 4(*a*) and 4(*b*) are views showing a second modified example of the circuit board and the chip package of FIGS. 2(*a*) and 2(*b*).
Figure 4B:
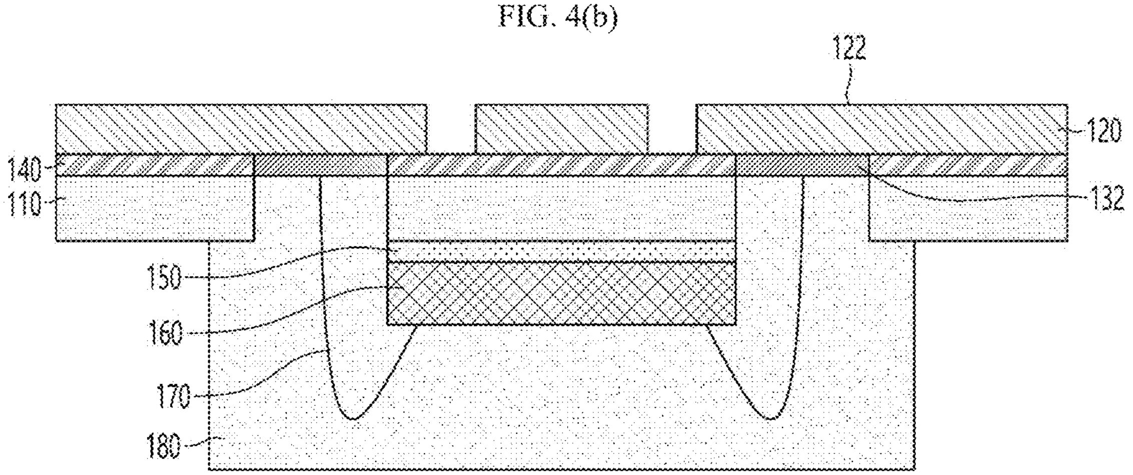

FIGS. 4(*a*) and 4(*b*) are views showing a second modified example of the circuit board and the chip package of FIGS. 2(*a*) and 2(*b*).

In FIGS. 2(*a*) and 2(*b*), the circuit pattern layer 120 and the insulating layer 110 have a structure in which they directly contact each other. That is, in FIGS. 2(*a*) and 2(*b*), the lower surface of the circuit pattern layer 120 is disposed in direct contact with the upper surface of the insulating layer 110.

Alternatively, referring to FIGS. 4(*a*) and 4(*b*), the circuit board may include the second adhesive layer 140 disposed between the insulating layer 110 and the circuit pattern layer 120. The second adhesive layer 140 may be disposed between the insulating layer 110 and the circuit pattern layer 120 to increase bonding strength between the insulating layer 110 and the circuit pattern layer 120.

The second adhesive layer 140 may refer to a bonding sheet disposed on the insulating layer 110. For example, the second adhesive layer 140 may be an epoxy, a thermosetting adhesive, an ultraviolet adhesive, or the like, but is not limited thereto.

Meanwhile, the through hole 115 formed in the insulating layer 110 may also be formed in the second adhesive layer 140. For example, the through hole 115 may pass through the insulating layer 110 and the second adhesive layer 140 in common.

Hereinafter, a circuit board according to the third embodiment will be described.

The circuit pattern layer 120 in the first and second embodiments is formed of a first alloy containing nickel (Ni) as a main component or a second alloy containing iron (Fe) as a main component. Accordingly, the bonding portion 121 of the circuit pattern layer 120 did not have a target wire bonding property. Accordingly, the surface treatment layer 130 was formed on the bonding portion 121.

Alternatively, in the third embodiment, the circuit pattern layer can have wire bonding property of a certain level or more by forming the circuit pattern layer using a third alloy manufactured on the basis of the first alloy or the second alloy. Accordingly, even the surface treatment layer formed in the bonding portion of the circuit pattern layer can be omitted or removed.

Figure 5A:
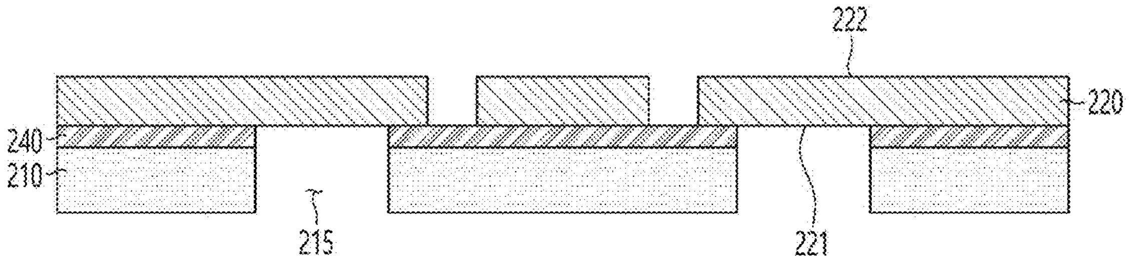
FIGS. 5(*a*) and 5(*b*) are views showing a circuit board according to a third embodiment.
Figure 5B:
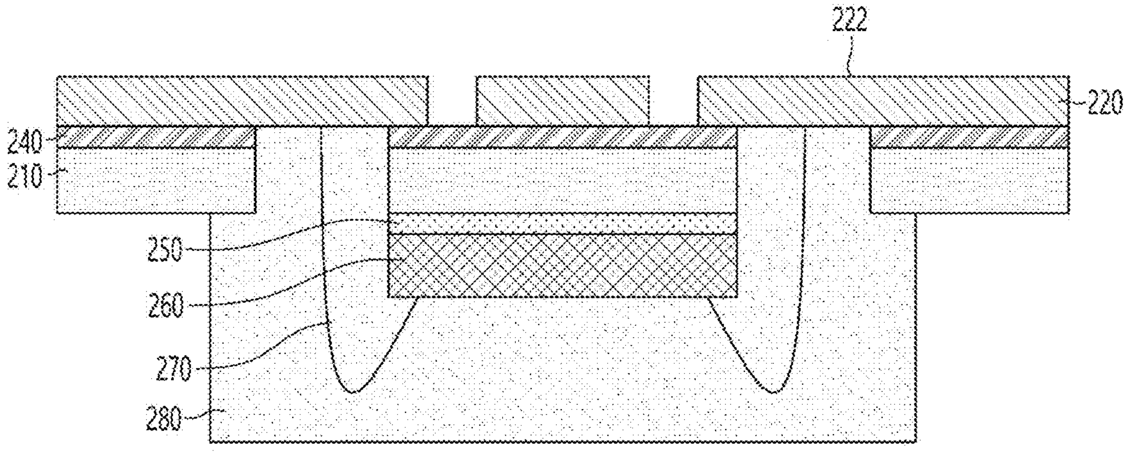

FIGS. 5(*a*) and 5(*b*) are views showing a circuit board according to a third embodiment.

Referring to FIGS. 5(*a*) and 5(*b*), the circuit board includes an insulating layer 210 and a circuit pattern layer 220. The circuit board may further include a second adhesive layer 240 serving as a bonding sheet disposed between the insulating layer 210 and the circuit pattern layer 220. The insulating layer 210 includes a through hole 215, and the circuit pattern layer 220 includes a bonding portion 221 and a contact portion 222. Since this has already been described with reference to FIGS. 2(*a*) to 4(*b*), a detailed description thereof will be omitted. In this case, a surface treatment layer may not be formed on the bonding portion 221 and the contact portion 222 of the circuit pattern layer 220. For example, the circuit pattern layer 220 in the embodiment may have wire bonding property, abrasion resistance, corrosion resistance, oxidation resistance, and hardness of a certain level or more, and thus the surface treatment layer may be removed. This may be achieved by the content of metals included in the alloy constituting the circuit pattern layer 220.

Accordingly, the connection member 270 of the chip package according to the third embodiment may directly connect the terminal of the IC chip 260 and the bonding portion 221 of the circuit pattern layer 220. That is, one end of the connecting member 270 may be directly connected to the terminal of the IC chip 260, and the other end may be directly connected to the lower surface of the circuit pattern layer 220 (specifically, the lower surface of the bonding portion 221).

The third alloy constituting the circuit pattern layer 220 in the third embodiment may be manufactured based on the first alloy having nickel (Ni) as a main component in the first embodiment, and alternatively, the second alloy having iron (Fe) as a main component in the second embodiment may be manufactured as a base.

Through this, the third alloy constituting the circuit pattern layer 220 of the third embodiment has resistance, etching rate, surface roughness change rate, nickel elution amount, and plating film adhesion corresponding to the characteristics of the first alloy and the second alloy.

In addition, the third alloy in the third embodiment is based on any one of the first alloy and the second alloy, and here, silver (Ag), silicon (Si), and any one of a silver (Ag)-silicon (Si) alloy is further included. Accordingly, the wire bonding property of the third alloy is higher than the wire bonding property of the first alloy and the second alloy. For example, the wire bonding property (gf) of the circuit pattern layer 220 formed of the third alloy may be 5 gf or more. For example, the wire bonding property (gf) of the circuit pattern layer 220 formed of the third alloy may be 7 gf or more. For example, the wire bonding property (gf) of the circuit pattern layer 220 formed of the third alloy may be 9 gf or more.

The third alloy will be described in detail.

For example, the circuit pattern layer 220 in the third embodiment may be formed using a third alloy. In this case, the third alloy may be an alloy in which any one of silver (Ag), silicon (Si), and a silver (Ag)-silicon (Si) alloy is further included in the first alloy of the first embodiment. Accordingly, the third alloy constituting the circuit pattern layer 220 in the third embodiment may be any one of a nickel (Ni)-chromium (Cr)-iron (Fe)-silver (Ag) alloy, nickel (Ni)-chromium (Cr)-iron (Fe)-silicon (Si) alloy and a nickel (Ni)-chromium (Cr)-iron (Fe)-silver (Ag)-silicon (Si) alloy.

Here, when the circuit pattern layer 220 is formed of any one of a nickel (Ni)-chromium (Cr)-iron (Fe)-silver (Ag) alloy, nickel (Ni)-chromium (Cr)-iron (Fe)-silicon (Si) alloy and a nickel (Ni)-chromium (Cr)-iron (Fe)-silver (Ag)-silicon (Si) alloy, the content of nickel (Ni), the content of chromium (Cr) and iron (Fe) may correspond to the content in the first alloy of the first embodiment. That is, when the circuit pattern layer 220 is formed of any one of a nickel (Ni)-chromium (Cr)-iron (Fe)-silver (Ag) alloy, nickel (Ni)-chromium (Cr)-iron (Fe)-silicon (Si) alloy and a nickel (Ni)-chromium (Cr)-iron (Fe)-silver (Ag)-silicon (Si) alloy, the content of nickel (Ni) may be 60 wt % to 80 wt %, the content of chromium (Cr) may be 10 wt % to 22 wt %, and the content of iron (Fe) may be 3 wt % to 20 wt %.

In addition, the circuit pattern layer 220 in the third embodiment may be formed of a third alloy. In this case, the third alloy may be an alloy in which at least one of silver (Ag) and silicon (Si) is further included in the second alloy according to the second embodiment. Accordingly, the third alloy forming the circuit pattern layer 220 in the third embodiment may be any one an iron (Fe)-chromium (Cr)-nickel (Ni)-silver (Ag) alloy, an iron (Fe)-chromium (Cr)-nickel (Ni)-silicon (Si) alloy and iron (Fe)-chromium (Cr)-nickel (Ni)-silver (Ag)-silicon (Si) alloy.

Here, when the circuit pattern layer 220 is formed of any one an iron (Fe)-chromium (Cr)-nickel (Ni)-silver (Ag) alloy, an iron (Fe)-chromium (Cr)-nickel (Ni)-silicon (Si) alloy and iron (Fe)-chromium (Cr)-nickel (Ni)-silver (Ag)-silicon (Si) alloy, the content of nickel (Ni), the content of chromium (Cr) and the content of iron (Fe) may correspond to each content in the iron (Fe)-chromium (Cr)-nickel (Ni) alloy of the second embodiment.

That is, when the circuit pattern layer 220 is formed of any one an iron (Fe)-chromium (Cr)-nickel (Ni)-silver (Ag) alloy, an iron (Fe)-chromium (Cr)-nickel (Ni)-silicon (Si) alloy and iron (Fe)-chromium (Cr)-nickel (Ni)-silver (Ag)-silicon (Si) alloy, the content of iron (Fe) may be 60 wt % to 80 wt %, the content of chromium (Cr) may be 10 wt % to 22 wt/o, and the content of nickel (Ni) may be 3 wt % to 20 wt %.

Meanwhile, as described above, the third alloy forming the circuit pattern layer 220 further includes at least one of silver (Ag) and silicon (Si).

That is, the third alloy constituting the circuit pattern layer 220 further includes any one of silver (Ag), silicon (Si), and a silver (Ag)-silicon (Si) alloy having a content in the range of 3 wt % to 10 wt %.

Accordingly, the content of nickel (Ni) in the third alloy constituting the circuit pattern layer 220 is 60 wt % to 80 wt %, and the content of chromium (Cr) is 10 wt % to 22 wt %, the content of iron (Fe) is 3 wt % to 20 wt %, and the content of any one metal among silver (Ag), silicon (Si) and silver (Ag)-silicon (Si) alloy is 3 wt % to 10 wt % %.

Alternatively, the content of iron (Fe) in the third alloy constituting the circuit pattern layer 220 is 60 wt % to 80 wt %, and the content of chromium (Cr) is 10 wt % to 22 wt %, the content of nickel (Ni) is 3 wt % to 20 wt %, and the content of any one metal among silver (Ag), silicon (Si) and silver (Ag)-silicon (Si) alloy is 3 wt % to 10 wt %.

In the third alloy constituting the circuit pattern layer 220, when the content of any one metal among silver (Ag), silicon (Si) and silver (Ag)-silicon (Si) alloy is less than 3 wt %, the wire bonding property of the bonding portion 221 of the circuit pattern layer 220 may have less than 4 gf, and thus the surface treatment layer to be formed on the bonding portion 221 of the circuit pattern layer 220 may not be omitted or removed.

In the third alloy constituting the circuit pattern layer 220, when the content of any one of silver (Ag), silicon (Si), and silver (Ag)-silicon (Si) alloy exceeds 10 wt %, the content of nickel (Ni) or chromium (Cr) or iron (Fe) is decreased, and accordingly, a problem may occur in at least one of the resistance (Ω), etching rate (μm/min), surface roughness change rate, and nickel elution amount of the circuit pattern layer 220.

Meanwhile, at least one additive may be included in the third alloy constituting the circuit pattern layer 220.

At this time, the additive in the first and second alloys constituting the circuit pattern layer of the first and second embodiments was at least one of molybdenum (Mo) and manganese (Mn).

Alternatively, the third alloy forming the circuit pattern layer 220 in the third embodiment further includes any one of silver (Ag), silicon (Si), and silver (Ag)-silicon (Si) alloy. Accordingly, the additive added to the third alloy may include a metal having good reactivity with any one of silver (Ag), silicon (Si) and silver (Ag)-silicon (Si) alloys.

For example, the third alloy forming the circuit pattern layer 220 of the third embodiment may contain any one additive selected from manganese (Mn), tin (Sn), zinc (Zn), and an alloy comprising at least two of these. The additive selected from manganese (Mn), tin (Sn), zinc (Zn), and an alloy comprising at least two of these may be added to refine the structure of the alloy constituting the circuit pattern layer 220 to achieve solid solution strengthening.

Specifically, a content of the additive selected from manganese (Mn), tin (Sn), zinc (Zn), and an alloy comprising at least two of these satisfies the range of 1 wt % to 5 wt %.

That is, when content of the additive selected from manganese (Mn), tin (Sn), zinc (Zn), and an alloy comprising at least two of these is less than 1 wt %, the solid solution strengthening effect is insufficient, and accordingly, abrasion resistance, oxidation resistance, and corrosion resistance of the circuit pattern layer 220 may be deteriorated. Specifically, when the content of the additive selected from manganese (Mn), tin (Sn), zinc (Zn), and an alloy comprising at least two of these is less than 1 wt %, metallic elements of nickel (Ni), chromium (Cr), and iron (Fe) may not mix well with each other in the process of manufacturing the third alloy according to the third embodiment. Thereby, it may be difficult to achieve crystal structuring. And, due to this, a problem in which the crystal phase of the alloy increases (e.g., a problem in which it is difficult to refine the crystal phase) may occur.

In addition, when content of the additive selected from manganese (Mn), tin (Sn), zinc (Zn), and an alloy comprising at least two of these exceeds 5 wt %, the resistance characteristic of the circuit pattern layer 220 may increase, and thus signal loss may increase.

In addition, when content of the additive selected from manganese (Mn), tin (Sn), zinc (Zn), and an alloy comprising at least two of these exceeds 5 wt %, the hardness of the circuit pattern layer 220 may increase, and thus the etching rate (μm/min) may decrease.

That is, in the embodiment, an additive including any one of manganese (Mn), tin (Sn), zinc (Zn), and an alloy comprising at least two of these is added. Thereby, the complete solid solution effect of the third alloy can be achieved. In addition, by suppressing the generation of the secondary crystal phase of the third alloy, it is possible to improve matching with gold (Au).

Furthermore, corrosion of the circuit pattern layer may be improved by forming a surface film.

In conclusion, when the third alloy is manufactured based on the first alloy, the optimal range of the composition ratio of the metals of the third alloy may be as follows.

Nickel (Ni) content: 70 wt % to 75 wt %

Chromium (Cr) content: 12 wt % to 18 wt %

Iron (Fe) content: 7 wt % to 11 wt %

Content of at least one metal among silver (Ag), silicon (Si) and silver (Ag)-silicon (Si): 3 wt % to 10 wt %

In addition, when the third alloy is manufactured based on the second alloy, the optimal range of the composition ratio of the metals of the third alloy may be as follows.

Iron (Fe) content: 63 wt % to 75 wt %

Chromium (Cr) content: 15 wt % to 20 wt %

Nickel (Ni) content: 7 wt % to 15 wt %

Content of at least one metal among silver (Ag), silicon (Si) and silver (Ag)-silicon (Si) alloy: 3 wt % to 10 wt %

Through this, the embodiment allows the properties such as resistance, etching rate, surface roughness change rate, nickel elution amount, rolling thickness, and plating film adhesion of the third alloy to have an optimum state, while also improving its wire bonding properties.

In conclusion, when the circuit pattern layer 120 is formed of third alloy having the composition ratio in the above-described range in the third embodiment, it was confirmed to have the resistance value in the range of 0.07Ω to 0.35Ω, an etching rate (μm/min) between 30 μm/min and 70 μm/min, the surface roughness change rate between 0.2% and 6.0%, the wire bonding property of 4 gf or more, the nickel elution amount of 0.28 $\mu g/cm^2$/week or less, and the plating adhesion of 5B or more.

In the embodiment, a circuit pattern layer is formed using a first alloy of nickel (Ni)-chromium (Cr)-iron (Fe) containing nickel (Ni) as a main component or a second alloy of iron (Fe)-chromium (Cr)-nickel (Ni) containing iron (Fe) as a main component. Accordingly, the circuit pattern layer of the embodiment may have abrasion resistance, corrosion resistance, oxidation resistance, and hardness of a certain level or more. Through this, the embodiment may omit or remove the surface treatment layer to be formed on the contact portion of the circuit pattern layer. Accordingly, the manufacturing process of the circuit board may be simplified and manufacturing cost may be reduced.

In addition, the circuit pattern layer is formed by using a third alloy in which at least one metal of silver (Ag) and silicon (Si) is further included in the first alloy or the second alloy. Through this, the circuit pattern layer may have a predetermined level or more of abrasion resistance, corrosion resistance, oxidation resistance, and hardness, as well as wire bonding property of a predetermined level or more. Through this, the embodiment may omit or remove all of the surface treatment layer to be formed on the contact portion and the bonding portion of the circuit pattern layer. Accordingly, the embodiment may further simplify the manufacturing process of the circuit board and further reduce the manufacturing cost.

Meanwhile, characteristics, structures and effects described in the embodiments of the present invention are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present invention.

The invention claimed is:

1. A circuit board for a smart IC card comprising:

an insulating layer including at least one through hole passing through upper and lower surfaces; and a circuit pattern layer disposed on the insulating layer and formed of an alloy, wherein an upper surface of the circuit pattern layer is a contact portion, and a lower surface of the circuit pattern layer in a region vertically overlapping the through hole is a bonding portion, wherein the alloy includes:

a first metal having a content in a range of 60 wt % to 80 wt %;

a second metal having a content in a range of 10 wt % to 22 wt %; and a third metal having a content in a range of 3 wt % to 20 wt %;

wherein the first metal includes any one of nickel (Ni) and iron (Fe), wherein the second metal includes chromium (Cr), and wherein the third metal includes a metal different from the first metal among nickel (Ni) and iron (Fe).

2. The circuit board of claim 1, wherein the first metal includes nickel (Ni), wherein the third metal includes iron (Fe), wherein the alloy includes a fourth metal having a content in a range of 1 wt % to 5 wt %, and wherein the fourth metal includes any one of molybdenum (Mo), manganese (Mn) and molybdenum (Mo)-manganese (Mn) alloy.

3. The circuit board of claim 1, wherein the first metal includes iron (Fe), wherein the third metal includes nickel (Ni), wherein the alloy includes a fourth metal having a content in a range of 0 wt % to 5 wt %, and wherein the fourth metal includes any one of molybdenum (Mo), manganese (Mn) and molybdenum (Mo)-manganese (Mn) alloy.

4. The circuit board of claim 1, wherein the upper surface of the circuit pattern layer is exposed to an outside without contacting other metals.

5. The circuit board of claim 1, comprising:

a surface treatment layer disposed on the bonding portion of the circuit pattern layer.

6. The circuit board of claim 5, wherein the surface treatment layer includes a gold metal layer disposed on the bonding portion of the circuit pattern layer and containing gold (Au).

7. The circuit board of claim 1, wherein the alloy includes a fifth metal having a content in a range of 3 wt % to 10 wt %, and wherein the fifth metal includes any one of silver (Ag), silicon (Si), and a silver (Ag)-silicon (Si) alloy.

8. The circuit board of claim 7, wherein the alloy includes a sixth metal having a content in a range of 1 wt % to 5 wt %, and wherein the sixth metal includes any one of Manganese (Mn), tin (Sn), zinc (Zn), and an alloy comprising at least two of these metals.

9. The circuit board of claim 1, comprising:

a bonding sheet disposed between the insulating layer and the circuit pattern layer, and wherein the bonding sheet includes a through hole.

10. A chip package comprising:

a circuit board for a smart IC card;

an IC chip disposed on the circuit board; and a connecting member connecting the circuit board and the IC chip, wherein the circuit board includes:

an insulating layer including at least one through hole passing through upper and lower surfaces;

a circuit pattern layer disposed on the insulating layer to vertically overlap the through hole and formed of an alloy, wherein an upper surface of the circuit pattern layer is a contact portion, and a lower surface of the circuit pattern layer in a region vertically overlapping the through hole is a bonding portion, wherein the circuit board includes a surface treatment layer disposed on the bonding portion of the circuit pattern layer, wherein the IC chip is attached to a lower surface of the insulating layer, wherein the connecting member connects the surface treatment layer and a terminal of the IC chip, wherein the alloy includes:

a first metal having a content in a range of 60 wt % to 80 wt %;

a second metal having a content in a range of 10 wt % to 22 wt %; and a third metal having a content in a range of 3 wt % to 20 wt %;

wherein the first metal includes any one of nickel (Ni) and iron (Fe), wherein the second metal includes chromium (Cr), and wherein the third metal includes a metal different from the first metal among nickel (Ni) and iron (Fe).

11. The chip package of claim 10, wherein the first metal includes nickel (Ni), wherein the third metal includes iron (Fe), wherein the alloy includes a fourth metal having a content in a range of 1 wt % to 5 wt %, and wherein the fourth metal includes any one of molybdenum (Mo), manganese (Mn) and molybdenum (Mo)-manganese (Mn) alloy.

12. The chip package of claim 10, wherein the first metal includes iron (Fe), wherein the third metal includes nickel (Ni), wherein the alloy includes a fourth metal having a content in a range of 0 wt % to 5 wt %, and wherein the fourth metal is any one of molybdenum (Mo), manganese (Mn) and molybdenum (Mo)-manganese (Mn) alloy.

13. The chip package of claim 10, wherein the upper surface of the circuit pattern layer is exposed to an outside without contacting other metals.

14. The chip package of claim 10, wherein the alloy includes a fifth metal having a content in a range of 3 wt % to 10 wt %, and wherein the fifth metal includes any one of silver (Ag), silicon (Si), and a silver (Ag)-silicon (Si) alloy.

15. The chip package of claim 14, wherein the alloy includes a sixth metal having a content in a range of 1 wt % to 5 wt %, and wherein the sixth metal includes any one of Manganese (Mn), tin (Sn), zinc (Zn), and an alloy comprising at least two of these metals.

16. The circuit board of claim 6, wherein the gold metal layer is in direct contact with the bonding portion.

17. The chip package of claim 14, wherein the circuit board includes a bonding sheet disposed between the insulating layer and the circuit pattern layer, and wherein the bonding sheet includes a through hole.

18. The chip package of claim 14, wherein an upper surface of the circuit pattern layer is exposed to an outermost side of the chip package.

* * * * *